United States Patent [19]

Numata

[11] Patent Number: 4,495,469
[45] Date of Patent: Jan. 22, 1985

[54] DIFFERENTIAL AMPLIFIER OUTPUT LEADING CIRCUIT, AND INTERMEDIATE FREQUENCY AMPLIFIER USING SAME

[75] Inventor: Tatsuo Numata, Tokyo, Japan

[73] Assignee: Pioneer Electronic Corporation, Tokyo, Japan

[21] Appl. No.: 442,328

[22] Filed: Nov. 17, 1982

[30] Foreign Application Priority Data

Nov. 17, 1981 [JP]  Japan ................................. 56-184053

[51] Int. Cl.³ ............................................. H03F 3/45
[52] U.S. Cl. ........................................ 330/2; 330/252; 455/154; 455/211
[58] Field of Search ..................... 330/2, 69, 252, 258; 329/111, 134; 307/540, 555, 567; 328/170; 455/210, 211, 205, 154

[56] References Cited

U.S. PATENT DOCUMENTS

| | | | |
|---|---|---|---|
| 3,290,520 | 12/1966 | Wennik | 330/69 X |
| 3,444,472 | 5/1969 | Johnson | 330/258 |
| 4,197,505 | 4/1980 | Nishijima et al. | 307/567 X |
| 4,272,728 | 6/1981 | Wittlinger | 330/258 X |

*Primary Examiner*—James B. Mullins

[57] ABSTRACT

A differential output leading circuit forming a part of an IF amplifier includes a pair of common collector connected transistors which receive, at control electrodes, outputs from a differential amplifier, by way of emitter follower circuits having constant current loads.

8 Claims, 3 Drawing Figures

INPUT LEVEL

INPUT LEVEL

DIFFERENTIAL AMPLIFIER OUTPUT LEADING CIRCUIT, AND INTERMEDIATE FREQUENCY AMPLIFIER USING SAME

BACKGROUND OF THE INVENTION

This invention relates to differential amplifier output leading circuits, and more particularly to a differential amplifier output leading circuit which is employed in the IF (intermediate frequency) amplifier stage of a tuner.

The IF amplifier of an FM tuner is, in general, designed so that differential amplifiers having a current limiter characteristic are cascade-connected in several stages, and the differential outputs of the differential amplifier of the last stage are applied to an FM detector circuit in the following stage. The outputs of these differential amplifiers are subjected to AM detection, to obtain an IF level signal meter driving signal. The signals for AM detection are provided by leading one of the differential outputs of each differential amplifier, and accordingly the loads of the pair of differential outputs of each differential amplifier are unbalanced. On the other hand, the FM detector circuit is designed so that it receives the balanced outputs of the IF amplifier. However, the balanced output is substantially unbalanced by the unbalanced loads of the differential amplifier described above. As a result, the AMR (amplitude variation elimination ratio) becomes considerably worse.

The differential outputs of each differential amplifier are applied through buffer circuits, or emitter follower circuits, to another differential amplifier in the next stage or to the FM detector circuit, and the load of each emitter follower circuit is a resistance load. Accordingly, the signal current flows through the resistance load to the reference voltage line, thus adversely affecting other circuits. In the case where the IF amplifier, the FM detector circuit, and other relevant circuits are integrated on a single semiconductor chip, this bad influence cannot be neglected; that is, the circuit becomes unstable, the AMR becomes worse, and the signal is distorted. FIG. 1 shows the signal characeristics of a multistage type IF amplifier and an FM detector circuit. In FIG. 1, the curves 11, 12, 13 and 14 indicate the variations of the FM detection level, AMR, the signal level and the signal distortion with respect to input levels, respectively. As is apparent from FIG. 1, the conventional circuit is disadvantageous in that, for the aforementioned reasons, the characteristics greatly vary with respect to the input signal levels.

SUMMARY OF THE INVENTION

An object of this invention is to provide a differential amplifier output leading circuit which can lead a drive output to a level meter or the like without affecting the balanced outputs of the differential amplifier.

Another object of the invention is to provide an IF amplifier in which deterioration in AMR of the tuner is prevented, and the signal distortion is minimized.

A specific feature of the differential amplifier output leading circuit according to the invention resides in that a pair of active elements, the controlled electrodes of which are commonly connected to one another, are provided, a pair of differential outputs of the differential amplifier being applied to the control electrodes of the pair of active elements, respectively.

Furthermore, a specific feature of the IF amplifier resides in that an IF signal is applied to the input of the differential amplifier described above, an IF signal meter driving signal is led out of the commonly connected electrodes of the pair of active elements, and a pair of differential outputs of the differential amplifier are supplied to a detector circuit.

DETAILED DESCRIPTION OF THE PREFERRED EMBODIMENTS

Figure 2:
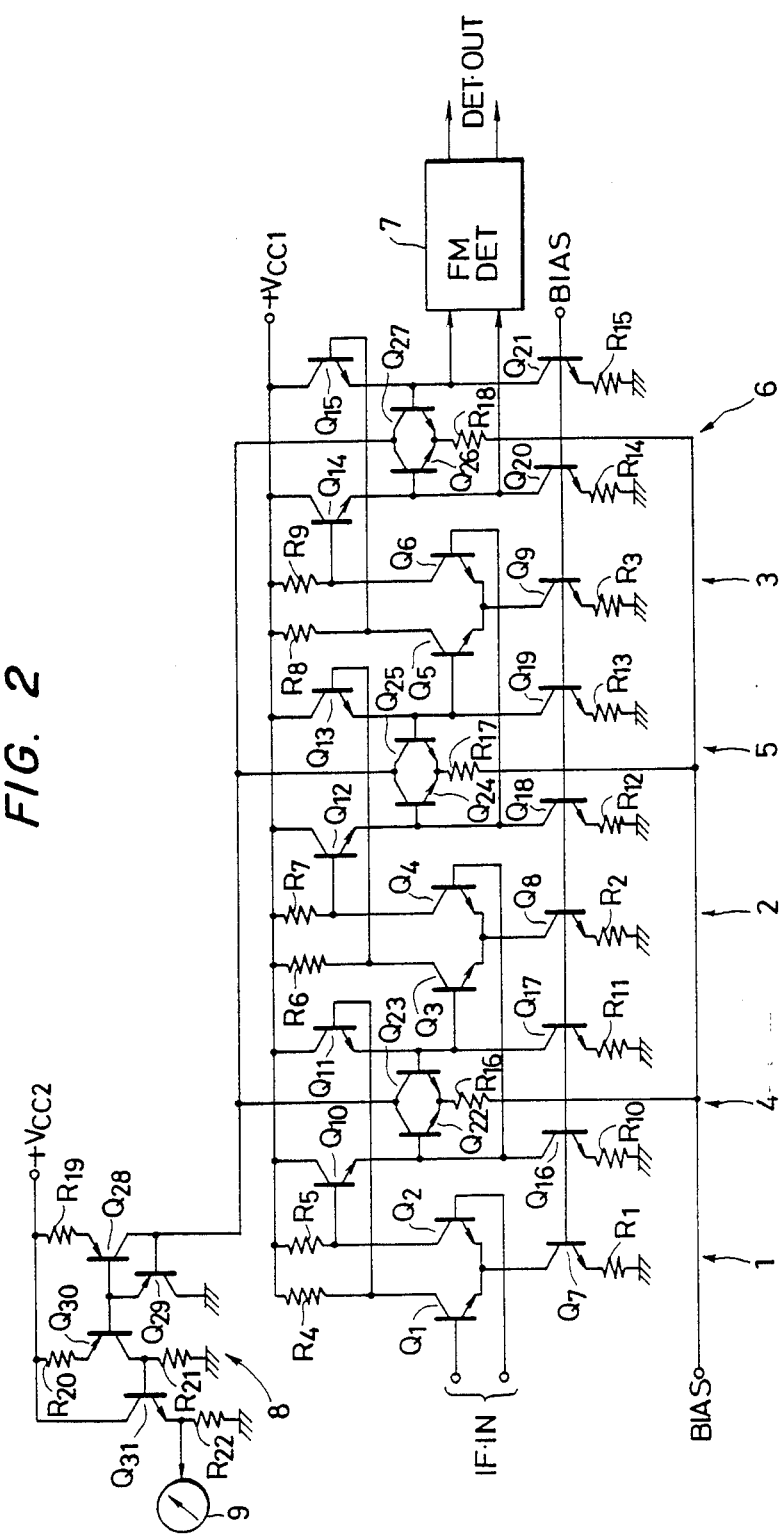
FIG. 2 is a circuit diagram showing an IF amplifier of an FM tuner according to one embodiment of this invention.

FIG. 2 is a circuit diagram of one embodiment of the invention, i.e., an IF amplifier in an FM tuner. The IF amplifier is made up of three stages 1, 2 and 3 of differential amplifiers which are cascade-connected. In order to lead the balanced differential outputs of the differential amplifiers 1, 2 and 3 to the following stage and to an IF signal meter driving amplifier 8, output leading circuits 4, 5 and 6 are provided. The balanced output of the output leading circuit 6 of the last stage is applied to an FM detector circuit 7 which comprises, for instance, a conventional quadrature detector. The differential amplifiers 1, 2 and 3 comprise differential transistor pairs $Q_1$ and $Q_2$, $Q_3$ and $Q_4$, and $Q_5$ and $Q_6$, respectively. Constant current sources for these differential transistors are comprised of a transistor $Q_7$ and a resistor $R_1$, a transistor $Q_8$ and a resistor $R_2$, and a transistor $Q_9$ and a resistor $R_3$, respectively. A predetermined bias voltage is applied to the bases of the transistors $Q_7$–$Q_9$.

Load resistors $R_4$ through $R_9$ are connected to the collectors of the differential transistors $Q_1$ through $Q_6$, respectively. Voltages developed across these load resistors are employed as balanced inputs to the output leading circuits 4, 5 and 6, respectively.

The output leading circuits 4, 5 and 6 include emitter follower transistors $Q_{10}$ and $Q_{11}$, $Q_{12}$ and $Q_{13}$, and $Q_{14}$ and $Q_{15}$, to the bases of which the balanced differential outputs of the differential amplifiers 1, 2 and 3 are applied, respectively. The loads of the emitter follower transistors $Q_{10}$–$Q_{15}$ are constant current loads made up of transistors $Q_{16}$ through $Q_{21}$ and resistors $R_{10}$ through $R_{15}$. Therefore, the predetermined bias voltage is commonly applied to the bases of the transistors $Q_{16}$ through $Q_{21}$. The emitter follower outputs are applied to the bases of transistor pairs $Q_{22}$ and $Q_{23}$, $Q_{24}$ and $Q_{25}$, and $Q_{26}$ and $Q_{27}$, respectively. In each of these pairs of transistors, the controlled electrodes thereof, i.e., the collectors and the emitters are connected to each other, respectively. A predetermined bias voltage is applied to the common emitters respectively through resistors $R_{16}$, $R_{17}$ and $R_{18}$. The common collectors are further connected together and are then connected to the input side of the driving circuit 8 for an IF signal meter.

The meter driving circuit 8 has a current mirror circuit comprising transistors $Q_{28}$ through $Q_{30}$ and resistors $R_{19}$ and $R_{20}$. The common collector outputs of the output leading circuits 4, 5 and 6 are applied to the input of the mirror circuit. A voltage developed across an output resistor $R_{21}$ of the mirror circuit is applied to an emitter follower circuit including a transistor $Q_{31}$ and a resistor $R_{22}$, to drive the meter 9. As an IF signal is supplied to the input of the differential amplifier 1 of the first stage, the circuit operates as an IF amplifier having a limiter function.

In the circuit thus organized, one pair of differential outputs of each of the differential amplifiers 1, 2 and 3 is led in balance to the following stage circuit and the IF signal meter driving circuit 8. Therefore, the loads of the emitter follower outputs are equal, and the balanced differential outputs of each differential amplifier are not unbalanced. Accordingly, no amplitude variation is caused in the input of the FM detector circuit 7, and therefore detection output distortion of the FM detector circuit due to amplitude variation is eliminated.

The loads of the emitter follower transistors $Q_{10}$ through $Q_{15}$ are constant current loads, and therefore signal currents are not applied to the earth line at all. Accordingly, the stability of the entire circuit is remarkably improved, and in association with the improvement in AMR, deterioration of the signal distortion is eliminated.

By setting the common emitter bias of the transistors $Q_{22}$ through $Q_{27}$ to a suitable value, these transistors can be operated as class B or C amplifiers, i.e., they can be used as AM detectors. In this case, the IF signal level can be readily detected. Furthermore, as these transistors are driven by opposite phase inputs, the detection output in this case is twice as large as that in the case where a single AM detection transistor is employed; that is, the detection efficiency is improved by as much.

Figure 1:
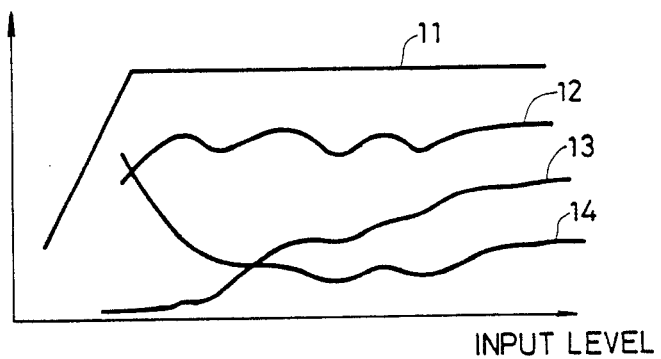
FIG. 1 is a graphical representation showing characteristics of a conventional IF amplifier of a tuner.
Figure 3:
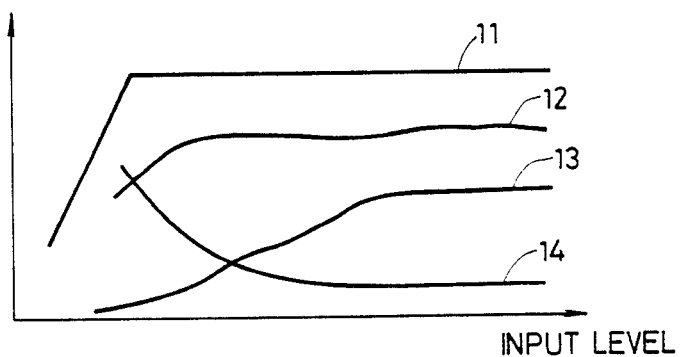
FIG. 3 is a comparison characteristic diagram showing the effect of the invention.

FIG. 3 shows the characteristics of the circuits in FIG. 2. In FIG. 3, these characteristics are designated by the same reference numerals as those in FIG. 1. As is apparent from FIG. 3, employment of the circuit according to the invention advantageously suppresses the variation in AMR, signal distortion and signal level with respect to the input levels.

As is apparent from the above description, according to the invention, with a very simple arrangement, differential balanced outputs can be obtained without unbalancing the outputs of the differential amplifiers. The application of this arrangement to an IF amplifier of a tuner will improve the AMR, and the signal distortion.

What is claimed is:

1. A differential amplifier output leading circuit, comprising: plural active elements, controlled electrodes of which are commonly connected; means for applying a pair of differential outputs of a differential amplifier respectively to control electrodes of said active elements, an output being led out of said commonly connected electrodes of said active elements; said applying means comprising a pair of emitter follower circuits receiving said pair of differential outputs as inputs thereof; and a pair of constant current sources constituting loads of said pair of emitter follower circuits, the emitter follower outputs of said pair of emitter follower circuit being applied to said control electrodes, respectively.

2. A circuit as claimed in claim 1, said constant current sources comprising transistor and resistor pairs having a predetermined bias voltage commonly applied thereto.

3. A circuit as claimed in claim 1, said plural active elements comprising a transistor pair having commonly connected collector and emitter electrodes, and receiving a predetermined bias voltage.

4. An intermediate frequency amplifier circuit, comprising: a differential amplifier to which an intermediate frequency signal is inputted; plural active elements, controlled electrodes of which are commonly connected; and means for applying a pair of differential outputs of said differential amplifier respectively to control electrodes of said active elements, a signal for an intermediate frequency level meter being led out of said commonly connected electrodes of said active elements, and means for supplying the pair of differential outputs of said differential amplifier to a detector circuit in a following stage.

5. A circuit as claimed in claim 4, said applying means comprising a pair of emitter follower circuits for receiving, as inputs thereof, said pair of differential outputs, respectively; and a respective pair of constant current sources constituting loads of said pair of emitter follower circuits, the emitter follower outputs of said pair of emitter follower circuits being applied to said control electrodes, respectively.

6. A circuit as claimed in claim 5, said constant current sources comprising transistor and resistor pairs having a predetermined bias voltage commonly applied thereto.

7. A circuit as claimed in claim 4, said plural active elements comprising a transistor pair having commonly connected collector and emitter electrodes, and receiving a predetermined bias voltage.

8. A circuit as claimed in claim 4, said intermediate frequency level meter including current mirror circuit means receiving an output signal from said commonly connected electrodes.

* * * * *